(12) United States Patent
Han et al.

(10) Patent No.: US 10,734,466 B2
(45) Date of Patent: Aug. 4, 2020

(54) ORGANIC LIGHT-EMITTING DISPLAY DEVICE

(71) Applicant: LG Display Co., Ltd., Seoul (KR)

(72) Inventors: Jeonphill Han, Seoul (KR); Ji-Heun Lee, Seoul (KR); TaeYong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/667,598

(22) Filed: Oct. 29, 2019

(65) Prior Publication Data

US 2020/0144350 A1    May 7, 2020

(30) Foreign Application Priority Data

Nov. 2, 2018 (KR) .......................... 10-2018-0133960

(51) Int. Cl.
*H01L 27/32* (2006.01)
(52) U.S. Cl.
CPC ...... *H01L 27/3272* (2013.01); *H01L 27/3246* (2013.01); *H01L 27/3258* (2013.01)

(58) Field of Classification Search
None
See application file for complete search history.

(56) References Cited

U.S. PATENT DOCUMENTS

| 2018/0006098 A1* | 1/2018 | Hong | H01L 51/5228 |
| 2018/0123078 A1* | 5/2018 | Byun | H01L 51/5206 |
| 2018/0190934 A1* | 7/2018 | Choi | H01L 27/3246 |
| 2019/0131369 A1* | 5/2019 | Choi | H01L 27/1255 |

\* cited by examiner

*Primary Examiner* — Michelle Mandala
(74) *Attorney, Agent, or Firm* — Seed IP Law Group LLP

(57) ABSTRACT

Provided is an organic light-emitting display (OLED) device. The organic light-emitting display (OLED) device includes a substrate; a shielding pattern; a buffer layer covering the shielding pattern and including a first contact hole and a second contact hole; a thin film transistor electrically connected to the shielding pattern through the first contact hole; a conductive material located on the thin film transistor; an insulating film covering the conductive material and including a third contact; a first electrode located on the insulating film and electrically connected to the shielding pattern; a bank covering the first electrode and including an opening against the conductive material; and an organic light emitting layer located on the first electrode while corresponding to the opening.

16 Claims, 6 Drawing Sheets

ORGANIC LIGHT-EMITTING DISPLAY DEVICE

CROSS-REFERENCE TO RELATED APPLICATIONS

This application claims the priority of Korean Patent Application No. 10-2018-0133960 filed on Nov. 2, 2018, in the Korean Intellectual Property Office, the disclosure of which is incorporated herein by reference.

BACKGROUND

Technical Field

The present disclosure relates to an organic light-emitting display device, and more particularly, forming an organic light emitting layer of the organic light-emitting display device.

Description of the Related Art

An organic light-emitting display device which is one of flat panel displays (FPDs) has the characteristics of high brightness and a low operating voltage. Further, the organic light-emitting display device has a high contrast ratio since it is a self-luminous display device. Furthermore, the organic light-emitting display device can be implemented as an ultra-thin display and can easily reproduce moving pictures due to its response time of several microseconds (µs). Also, the organic light-emitting display device has no limitation of a viewing angle and can stably operate at a low temperature. Since the organic light-emitting display device can be driven at a low direct current voltage of 5 V to 15 V, it is easy to manufacture and design a driving circuit.

Therefore, recently, organic light-emitting display devices having the above-described advantages have been used in various IT devices such as TVs, monitors, mobile phones, etc.

Such an organic light-emitting display device includes an organic light emitting layer and displays an image using light emitted from the organic light emitting layer. The organic light emitting layer is typically formed by a thermal deposition method using a shadow mask.

BRIEF SUMMARY

With an increase in size of organic light-emitting display devices, there has been a need to perform thermal deposition using a large-size shadow mask to form the organic light emitting layer. However, as the shadow mask becomes larger, the shadow mask may sag, which may cause a deposition defect of the organic light emitting layer during thermal deposition.

As a shadow mask used for manufacturing large-area organic light-emitting display devices increases in size, sagging of the shadow mask increases. Thus, more deposition defects of organic light emitting layers may occur.

Under these circumstances, one embodiment of the present disclosure provides a method of forming an organic light emitting layer as an alternative to a thermal deposition process using a shadow mask to manufacture a large-area organic light-emitting display device.

In the suggested method of forming an organic light emitting layer according to one embodiment of the present disclosure, a liquid phase organic light-emitting material is sprayed or dropped in a region surrounded by a wall using an ink-jet apparatus or a nozzle-coating apparatus and then cured to form the organic light emitting layer.

It should be noted that the present disclosure are not limited to those described above and other embodiments of the present disclosure will be apparent to those skilled in the art from the following descriptions.

To spray or drop a liquid phase organic light-emitting material to each pixel region using an ink-jet apparatus or a nozzle-coating apparatus, it is beneficial to suppress flooding of the liquid phase organic light-emitting material to the neighboring the pixel region. That is, a bank for suppressing flooding of the organic light-emitting material to the neighboring pixel region where an electrode is formed may be beneficial.

When a head of the ink-jet apparatus or a nozzle of the nozzle-coating apparatus is located above the pixel region to spray or drop the liquid phase organic light-emitting material, the pixel region may be filled with the organic light-emitting material. The bank can suppress flooding of the organic light-emitting material to the neighborhood. The organic light-emitting material formed in the pixel region is dried and cured by heat treatment to form an organic light emitting layer.

However, if the organic light emitting layer is formed using the ink-jet apparatus or the nozzle-coating apparatus, the organic light emitting layer has a greater thickness in edges of the pixel region adjacent to the bank than in the center of the pixel region.

This is because, during the curing process, curing starts from the center and a portion in contact with the bank is cured relatively slowly and internally, the organic light-emitting material is moved to the edges in the pixel region and then finally cured in this state.

Therefore, due to such a phenomenon, in the pixel region, the organic light emitting layer has a flat center with little difference in thickness, but the organic light emitting layer has a cross-sectional form that gradually increases in thickness toward the edges adjacent to the bank.

Further, as a structure of a circuit unit under the organic light emitting layer becomes complicated to drive an organic light-emitting display device, it becomes difficult to make the organic light emitting layer on the circuit unit have a flat surface.

Accordingly, since the organic light emitting layer cannot be formed flat, it cannot emit light with uniform brightness. Thus, a user may perceive it as mura or an area where light is not actually emitted may be displayed dark. Further, if an additional laminated structure is further provided to flatten the circuit unit, an aperture ratio of the organic light-emitting display device may decrease.

The inventors of the present disclosure can change the structure of the circuit under the organic light emitting layer to make the circuit unit flat without an additional laminated structure. Accordingly, an object to be achieved by the present disclosure is to provide an organic light-emitting display device in which an organic light emitting layer on a circuit unit has a uniform profile.

According to an aspect of the present disclosure, an organic light-emitting display device is provided. The organic light-emitting display device includes a substrate, a shielding pattern located on the substrate, and a buffer layer covering the shielding pattern and including a first contact hole and a second contact hole. The organic light-emitting display device also includes a thin film transistor located on the buffer layer and electrically connected to the shielding pattern through the first contact hole. The organic light-emitting display device further includes a conductive material located on the thin film transistor and an insulating film covering the conductive material and including a third contact hole corresponding to the second contact hole. The organic light-emitting display device also includes a first electrode located on the insulating film and electrically connected to the shielding pattern through the second contact hole and the third contact hole. The organic light-emitting display device further includes a bank covering the first electrode and including an opening against the conductive material and an organic light emitting layer located on the first electrode while corresponding to the opening.

The conductive material includes a first conductive material and a second conductive material, and the first conductive material is electrically connected to the thin film transistor.

The second conductive material includes a gate insulating film thereunder and is electrically connected to an active layer included in the thin film transistor.

The first conductive material is formed of the same material as the second conductive material.

The second conductive material is a gate material.

The shielding pattern is a source electrode or a drain electrode electrically connected to the active layer.

The shielding pattern is further located on one side of the substrate and receives an external signal.

The shielding pattern is formed of the same material as the conductive material.

The organic light-emitting display device further includes an auxiliary bank located on the bank.

The height of the auxiliary bank is higher than the height of the bank.

The organic light emitting layer covers a side surface and a top surface of the bank and a part of a side surface of the auxiliary bank.

The bank is provided as one body having a matrix structure.

The auxiliary bank has a linear structure.

The bank is formed of a hydrophilic organic insulating material.

The auxiliary bank is formed of a hydrophobic organic insulating material.

A top surface of the auxiliary bank has a hydrophobic property to suppress spread of the organic light emitting layer.

According to the present disclosure, it is possible to flatten a circuit unit without an additional laminated structure in an organic light-emitting display device. Therefore, a decrease in aperture ratio of an organic light emitting layer can be minimized.

According to the present disclosure, the organic light emitting layer is formed uniformly from the center of a pixel to edges adjacent to a bank in the organic light-emitting display device. Therefore, the organic light emitting layer can have uniform luminescent properties throughout an emission area.

It should be noted that effects of the present disclosure are not limited to those described above and other effects of the present disclosure will be apparent to those skilled in the art from the following descriptions.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
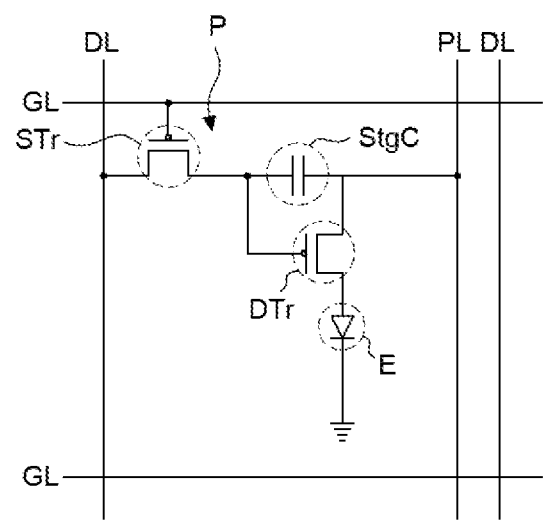
FIG. 1 is a circuit diagram for a pixel region of an organic light-emitting display device.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," and "having" used herein are generally intended to allow other components to be added unless the terms are used with the term "only". Any references to singular may include plural unless expressly stated otherwise.

Components are interpreted to include an ordinary error range even if not expressly stated.

When the two parts are described using the terms such as "on", "above", "below", "next", "adjacent", "coupled", "connected", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a circuit diagram for a pixel region of an organic light-emitting display device. FIG. 1 is a circuit diagram showing the configuration and operation of a pixel region in an organic light-emitting display device of the present disclosure.

As shown in FIG. 1, a switching thin film transistor STr, a driving thin film transistor DTr, a storage capacitor StgC, and an organic light emitting diode E are provided in a pixel region P of the organic light-emitting display device.

Gate lines GL are provided in a first direction and data lines DL are provided in a second direction intersecting the first direction. Thus, the pixel region P is formed as a region surrounded by the gate lines GL and the data lines DL. Herein, a power line PL for applying a power voltage may be provided as spaced apart from the data lines DL. The present circuit diagram schematically illustrates a single power line PL. However, there may be a plurality of power lines PL including a high-potential line VDD and a low-potential line VSS.

Further, the switching thin film transistor STr may be provided at an intersection between the data line DL and the gate line GL. In this case, the driving thin film transistor DTr may be provided to be electrically connected to the switching thin film transistor STr. The driving thin film transistor DTr may be electrically connected to the organic light emitting diode E. In this case, the organic light emitting diode E is composed of a first electrode, an organic light emitting layer, and a second electrode.

The first electrode is a terminal on one side of the organic light emitting diode E and may be connected to a drain electrode of the driving thin film transistor DTr. The other terminal, e.g., the second electrode, of the organic light emitting diode E may be grounded. In this case, the power voltage transmitted through the power line PL may be transmitted to the organic light emitting diode E through the driving thin film transistor DTr. Further, the storage capacitor StgC may be provided between a gate electrode and a source electrode of the driving thin film transistor DTr.

Therefore, when a signal is applied through the gate lines GL, the switching thin film transistor STr is turned on. Also, a signal of the data lines DL is transmitted to the gate electrode of the driving thin film transistor DTr, and, thus, the driving thin film transistor DTr is turned on. Accordingly, light may be output through the organic light emitting diode E.

In this case, when the driving thin film transistor DTr is turned on, a level of a current flowing from the power line PL to the organic light emitting diode E is determined. Thus, the organic light emitting diode E can implement a gray scale.

When the switching thin film transistor STr is turned off, the storage capacitor StgC may serve to maintain a constant gate voltage of the driving thin film transistor DTr. Therefore, even when the switching thin film transistor STr is turned off, the storage capacitor StgC may maintain a constant level of a current flowing in the organic light emitting diode E to a next frame.

Figure 2:
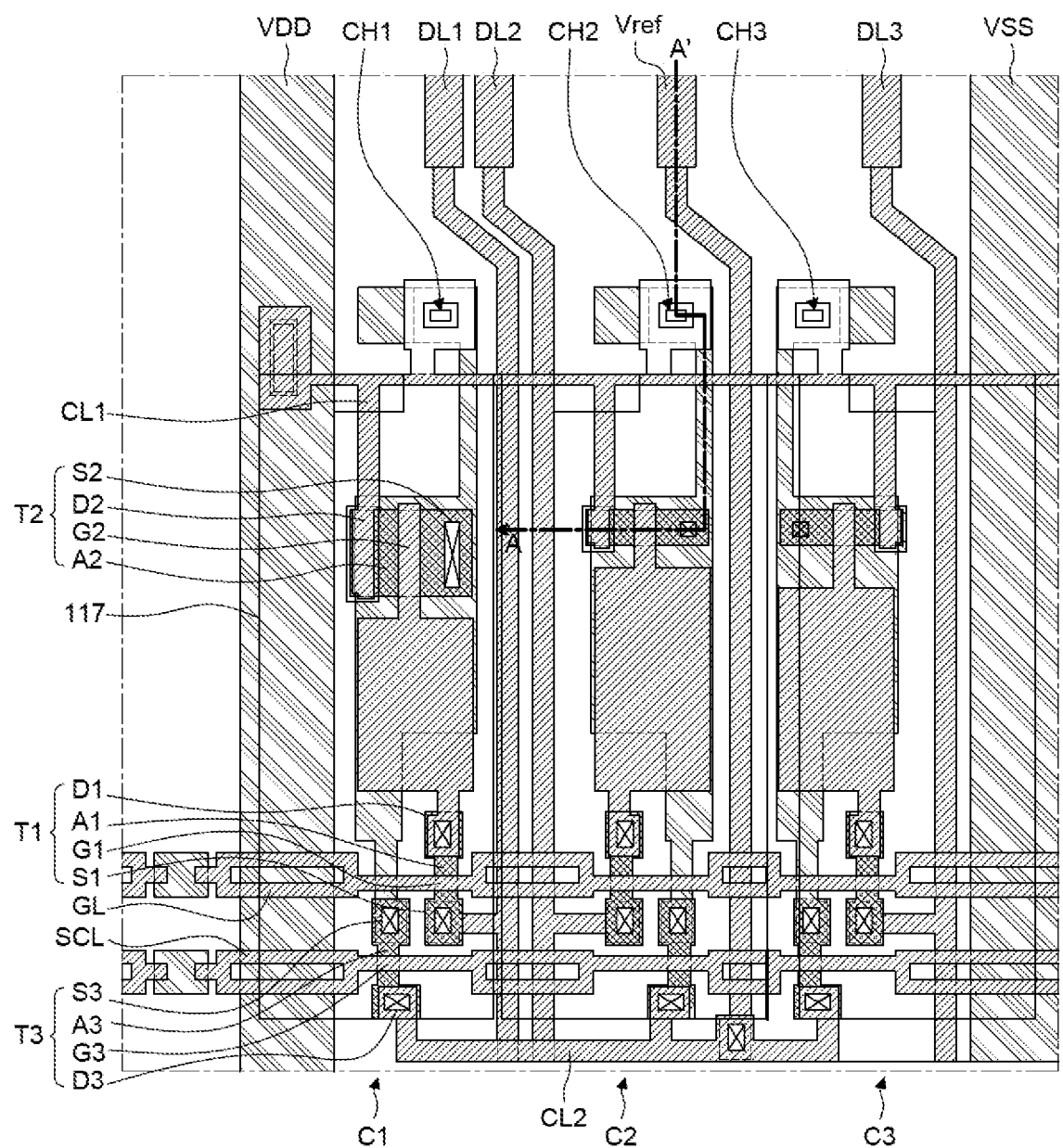
FIG. 2 is a plan view of an organic light-emitting display device according to an embodiment of the present disclosure.

FIG. 2 is a plan view of an organic light-emitting display device according to an embodiment of the present disclosure. FIG. 2 is a plan view showing various placements of a plurality of emission areas in a circuit configuration of the organic light-emitting display device according to an embodiment of the present disclosure.

As shown in FIG. 2, an organic light-emitting display device 100 may include a gate line GL, a sensing control line SCL, a high-potential line VDD, a low-potential line VSS, data lines DL1, DL2, and DL3, and a reference line Vref. Also, the organic light-emitting display device 100 includes a switching thin film transistor T1, a driving thin film transistor T2, a sensing thin film transistor T3, a capacitor C, and an organic light emitting diode OLED.

In this case, the gate line GL and the sensing control line SCL may be aligned in a transverse direction. Also, the high-potential line VDD, the low-potential line VSS, the data lines DL1, DL2, and DL3, and the reference line Vref may be aligned in a vertical direction.

The gate line GL is aligned in the transverse direction and supplies a gate signal to a gate terminal of the switching thin film transistor T1 provided in each of circuit columns C1, C2, and C3.

The sensing control line SCL is spaced apart at a predetermined distance from the gate line GL and aligned in the transverse direction parallel to the gate line GL. The sensing control line SCL supplies a sensing control signal to a gate terminal of the sensing thin film transistor T3 provided in each of the circuit columns C1, C2, and C3.

Herein, the gate line GL and the sensing control line SCL may be formed of the same material on the same layer. Further, the gate line GL and the sensing control line SCL may be formed by the same process. Specifically, the gate line GL and the sensing control line SCL may be formed of a gate material. For example, the gate line GL and the sensing control line SCL may be formed of any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto. The gate line GL and the sensing control line SCL may be formed of various materials by the same process in order to reduce additional steps during the manufacturing process. However, in other embodiments, the gate line GL and the sensing control line SCL may be formed through a different, separate process. Further, each of the gate line GL and the sensing control line SCL may be a single layer or a multilayer.

The high-potential line VDD may be aligned in the vertical direction intersecting the gate line GL and the sensing control line SCL. The high-potential line VDD supplies power to a drain terminal of the driving thin film transistor T2 provided in each of the circuit columns C1, C2, and C3.

According to an embodiment of the present disclosure, the high-potential line VDD is configured to simultaneously supply high power to the drain terminals of the driving thin film transistors T2 provided in the respective circuit columns C1, C2, and C3. Therefore, a first connection line CL1 is provided to connect the high-potential line VDD to the drain terminals of the respective driving thin film transistors T2.

The first connection line CL1 is extended from the high-potential line VDD across the circuit columns C1, C2, and C3 in the transverse direction. Therefore, the first connection line CL1 may be connected to the high-potential line VDD and may also be connected to the drain terminals of the driving thin film transistors T2 provided in the respective circuit columns C1, C2, and C3.

The low-potential line VSS may be aligned in the vertical direction parallel to the high-potential line VDD. The low-potential line VSS may supply low power to a cathode of the organic light emitting diode OLED. The cathode may be formed on the entire surface of the substrate. Therefore, a connection line such as the first connection line CL1 may not be needed to connect the low-potential line VSS to the cathode of each organic light emitting diode OLED. Specifically, the cathode formed on the entire substrate is connected to the low-potential line VSS through a predetermined contact hole.

Herein, the width of the high-potential line VDD and the width of the low-potential line VSS may be larger than the widths of the data lines DL1, DL2, and DL3 and the width of the reference line Vref.

The data lines DL1, DL2, and DL3 may be aligned in the vertical direction. In this case, the data lines DL1, DL2, and DL3 may be formed between the high-potential line VDD and the low-potential line VSS. The data lines DL1, DL2, and DL3 may be composed of a first data line DL1, a second data line DL2, and a third data line DL3.

As shown from FIG. 2, the first data line DL1 faces the high-potential line VDD on the left and another data line DL2 on the right. In this case, the first data line DL1 and the high-potential line VDD are spaced apart at a predetermined distance from each other. However, the first data line DL1 and the second data line DL2 are adjacent to each other.

Specifically, a first circuit column C1 including circuit components such as the switching thin film transistor T1, the driving thin film transistor T2, the sensing thin film transistor T3 and the capacitor C is placed between first data line DL1 and the high-potential line VDD. In some embodiments, any circuit column including circuit components may not be placed between the first data line DL1 and the second data line DL2. However, in other embodiments, any circuit column including circuit components may be placed between the first data line DL1 and the second data line DL2.

The second data line DL2 is adjacent to the first data line DL1 on the left and spaced apart from the reference line Vref on the right. In this case, a second circuit column C2 is placed between the second data line DL2 and the reference line Vref.

The third data line DL3 is spaced apart from the second data line DL2 on the left by a third circuit column C3. In this case, the third data line DL3 is adjacent to the low-potential line VSS on the right.

The data lines DL1, DL2, and DL3 may supply a data voltage to source terminals of the switching thin film transistors T1 provided in the circuit columns C1, C2, and C3, respectively.

The reference line Vref may be placed between the high-potential line VDD and the low-potential line VSS and extended in the vertical direction. In this case, the reference line Vref may be disposed between the second circuit column C2 on the left and the third circuit column C3 on the right. Therefore, the reference line Vref may be spaced apart from the second data line DL2 on the left and the third data line DL3 on the right.

The reference line Vref may be connected to a drain terminal of the sensing thin film transistor T3 provided in each of the circuit columns C1, C2, and C3.

According to an embodiment of the present disclosure, the reference line Vref may be connected to the drain terminals of the sensing thin film transistor T3 provided in the respective circuit columns C1, C2, and C3. Therefore, a second connection line CL2 is provided to connect the reference line Vref to the drain terminals of the respective sensing thin film transistor T3.

The second connection line CL2 is extended from the reference line Vref across the circuit columns C1, C2, and C3 in the transverse direction. Therefore, the second connection line CL2 may be connected to the reference line Vref and may also be connected to the drain terminals of the sensing thin film transistor T3 provided in the respective circuit columns C1, C2, and C3.

The high-potential line VDD, the low-potential line VSS, the data lines DL1, DL2, and DL3, and the reference line Vref may be formed of the same material on the same layer. Further, the high-potential line VDD, the low-potential line VSS, the data lines DL1, DL2, and DL3, and the reference line Vref may be formed by the same process. Specifically, the high-potential line VDD, the low-potential line VSS, the data lines DL1, DL2, and DL3, and the reference line Vref may be formed of a conductive material. In this case, the conductive material may be the same as a gate material.

The first connection line CL1 and the second connection line CL2 may be formed of the same material on the same layer. Further, the first connection line CL1 and the second connection line CL2 may be formed on the same layer by the same process as the gate line GL and the sensing control line SCL. Specifically, the first connection line CL1 and the second connection line CL2 may be formed of a gate material. For example, the first connection line CL1 and the second connection line CL2 may be formed of any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto. The first connection line CL1 and the second connection line CL2 may be formed of various materials by the same process. Further, each of the first connection line CL1 and the second connection line CL2 may be a single layer or a multilayer. In other embodiments, the first connection line CL1 and the second connection line CL2 may be formed through a different, separate process.

The switching thin film transistor T1, the driving thin film transistors T2, the sensing thin film transistor T3, and the capacitor C may be provided in each of the circuit columns C1, C2, and C3.

The switching thin film transistor T1 is switched in response to a gate signal supplied to the gate line GL. Then, the switching thin film transistor T1 supplies the driving thin film transistor T2 with the data voltage supplied from the data lines DL1, DL2, and DL3 corresponding to the circuit columns C1, C2, and C3.

The driving thin film transistor T2 is switched in response to the data voltage supplied from the switching thin film transistor T1. Then, the driving thin film transistor T2 may generate a data current from high power supplied from the high-potential line VDD and supply the data current to the organic light emitting diode OLED.

The sensing thin film transistor T3 is configured to sense a threshold voltage difference of the driving thin film transistor T2 which causes image quality degradation. The threshold voltage difference can be sensed in a sensing mode. The sensing thin film transistor T3 may supply a voltage of the driving thin film transistor T2 to the reference line Vref in response to a sensing control signal supplied from the sensing control line SCL.

The capacitor C serves to maintain the data voltage supplied to the driving thin film transistor T2 for a frame and may be connected to a gate terminal and a source terminal of the driving thin film transistor T2.

The organic light emitting diode OLED may emit a predetermined light according to the data current supplied from the driving thin film transistor T2. The organic light emitting diode OLED may be composed of an anode, a cathode, and an organic light emitting layer provided between the anode and the cathode.

The anode of the organic light emitting diode OLED may be connected to the source terminal of the driving thin film transistor T2 and the cathode of the organic light emitting diode OLED may be connected to the low-potential line VSS.

For convenience of description, FIG. 2 illustrates the organic light emitting diodes OLED in each of the circuit columns C1, C2, and C3. However, some of the organic light emitting diodes OLED may be provided overlapping the high-potential line VDD or the low-potential line VSS. Further, some of the organic light emitting diodes OLED may be provided overlapping a plurality of circuit columns C1, C2, and C3 adjacent to each other at substantially the same time.

The first circuit column C1 may be located between the high-potential line VDD and the first data line DL1. In this case, the switching thin film transistor T1, the driving thin film transistor T2, and the sensing thin film transistor T3 may be provided in the first circuit column C1.

The switching thin film transistor T1 provided in the first circuit column C1 may be composed of a first gate electrode G1, a first source electrode S1, a first drain electrode D1, and a first active layer A1.

The first gate electrode G1 may be a part of the gate line GL but is not necessarily limited thereto. The first gate electrode G1 may be branched from the gate line GL.

The first source electrode S1 may be branched from the first data line DL1.

The first drain electrode D1 may be formed of a gate material located on an upper part of the first active layer A1. Specifically, the first drain electrode D1 may be a part branched from a second gate electrode G2 of the driving thin film transistor T2 which is extended in the vertical direction. Therefore, the gate material, the part branched from the extended second gate electrode G2, may be electrically connected to the first active layer A1 of the switching thin film transistor T1 and may serve as the first drain electrode D1.

The first source electrode S1 and the first drain electrode D1 may be electrically connected to the first active layer A1 through separate contact holes, respectively. Otherwise, the first source electrode S1 and the first drain electrode D1 may be electrically connected in direct contact with the first active layer A1 and may serve as an electron movement channel.

The driving thin film transistor T2 provided in the first circuit column C1 may be composed of the second gate electrode G2, a second source electrode S2, a second drain electrode D2, and a second active layer A2.

In the second gate electrode G2, the part extended and branched in the vertical direction may serve as the first drain electrode D1 of the switching thin film transistor T1 as described above. Thus, the second gate electrode G2 may be electrically connected to the switching thin film transistor T1. In this case, the second gate electrode G2 may be formed on the same layer as the first gate electrode G1.

That is, the first drain electrode D1 of the switching thin film transistor T1 and the second gate electrode G2 of the driving thin film transistor T2 may be formed as one body of a gate material.

The second drain electrode D2 may be a part branched from the first connection line CL1. In this case, the first connection line CL1 is electrically connected to the high-potential line VDD through a contact hole. The first connection line CL1 may be extended across the circuit columns C1, C2, and C3 in the transverse direction while intersecting the high-potential line VDD extended in the vertical direction. Therefore, the branched part of the first connection line CL1 may be electrically connected to the second active layer A2 of the driving thin film transistor T2 and may serve as the second drain electrode D2.

The second source electrode S2 may be a part of a shielding pattern LS located under the second active layer A2. Therefore, the second source electrode S2 as a part of the shielding pattern LS may be in contact with the second active layer A2. In this case, the shielding pattern LS may have a relatively large area and thus may increase the capacitance of the capacitor C.

The shielding pattern LS serves to shield incident light into the second active layer A2 of the driving thin film transistor T2. Therefore, the shielding pattern LS may have a larger area than the second active layer A2 and may be located under the second active layer A2 so as to overlap the second active layer A2.

In this case, the shielding pattern LS may have a branched part. The branched part of the shielding pattern LS may be connected to an anode of an organic light emitting diode through a contact hole. The location of the contact hole for connection with the anode of the organic light emitting diode may be appropriately changed.

Further, another part of the shielding pattern LS may be branched and electrically connected to a third active layer A3 of the sensing thin film transistor T3. In this case, the other part of the shielding pattern LS connected to the third active layer A3 of the sensing thin film transistor T3 may serve as a third source electrode S3 of the sensing thin film transistor T3.

That is, the second source electrode S2 of the driving thin film transistor T2 and the third source electrode S3 of the sensing thin film transistor T3 may be formed into the shielding pattern LS as one body.

In this case, the second source electrode S2 and the second drain electrode D2 may be electrically connected to the second active layer A2 through separate contact holes, respectively. Otherwise, the second source electrode S2 and the second drain electrode D2 may be electrically connected in direct contact with the second active layer A2 and may serve as an electron movement channel. The second active layer A2 may be formed of the same material on the same layer as the first active layer A1.

The sensing thin film transistor T3 provided in the first circuit column C1 may be composed of a third gate electrode G3, the third source electrode S3, a third drain electrode D3, and the third active layer A3.

The third gate electrode G3 may be a part of the sensing control line SCL but is not necessarily limited thereto. The third gate electrode G3 may be branched from the sensing control line SCL.

The third source electrode S3 of the sensing thin film transistor T3 may be formed as one body with the second source electrode S2 of the driving thin film transistor T2 as described above. That is, the third source electrode S3 may be another part of the shielding pattern LS branched and electrically connected to the third active layer A3 of the sensing thin film transistor T3.

The third drain electrode D3 may be a part branched from the second connection line CL2. In this case, the second connection line CL2 is electrically connected to the reference line Vref through a contact hole. The second connection line CL2 may be extended in the transverse direction while intersecting the reference line Vref extended in the vertical direction. Therefore, the branched part of the second connection line CL2 may be electrically connected to the third active layer A3 of the sensing thin film transistor T3 and may serve as the third drain electrode D3. In this case, the second connection line CL2 may be formed of the same material on the same layer as the third gate electrode G3.

In this case, the third source electrode S3 and the third drain electrode D3 may electrically be connected to the third active layer A3 through separate contact holes. Otherwise, the third source electrode S3 and the third drain electrode D3 may be electrically connected in direct contact with the third active layer A3 and may serve as an electron movement channel. The third active layer A3 may be formed of the same material on the same layer as the first active layer A1.

The second circuit column C2 may be located between the second data line DL2 and the reference line Vref. The switching thin film transistor T1, the driving thin film transistor T2, and the sensing thin film transistor T3 may be provided in the second circuit column C2.

The switching thin film transistor T1 provided in the second circuit column C2 has substantially the same electrical connection structure as the switching thin film transistor T1 provided in the first circuit column C1 except that the first source electrode S1 is branched from the second data line DL2.

The driving thin film transistor T2 and the sensing thin film transistor T3 provided in the second circuit column C2 has substantially the same electrical connection structure as the driving thin film transistor T2 and the sensing thin film transistor T3 provided in the above-described first circuit column C1.

The shielding pattern LS substantially similar or identical to that of the first circuit column C1 is also formed in the second circuit column C2.

The third circuit column C3 may be located between the reference line Vref and the third data line DL3. The switching thin film transistor T1, the driving thin film transistor T2, and the sensing thin film transistor T3 may be provided in third circuit column C3.

The switching thin film transistor T1 provided in the third circuit column C3 has the same electrical connection structure as the switching thin film transistor T1 provided in the first circuit column C1 except that the first source electrode S1 is branched from the third data line DL3.

The driving thin film transistor T2 and the sensing thin film transistor T3 provided in the third circuit column C3 has the same electrical connection structure as the driving thin film transistor T2 and the sensing thin film transistor T3 provided in the above-described first circuit column C1.

The shielding pattern LS substantially similar or identical to that of the first circuit column C1 is also formed in the third circuit column C3.

Figure 3:
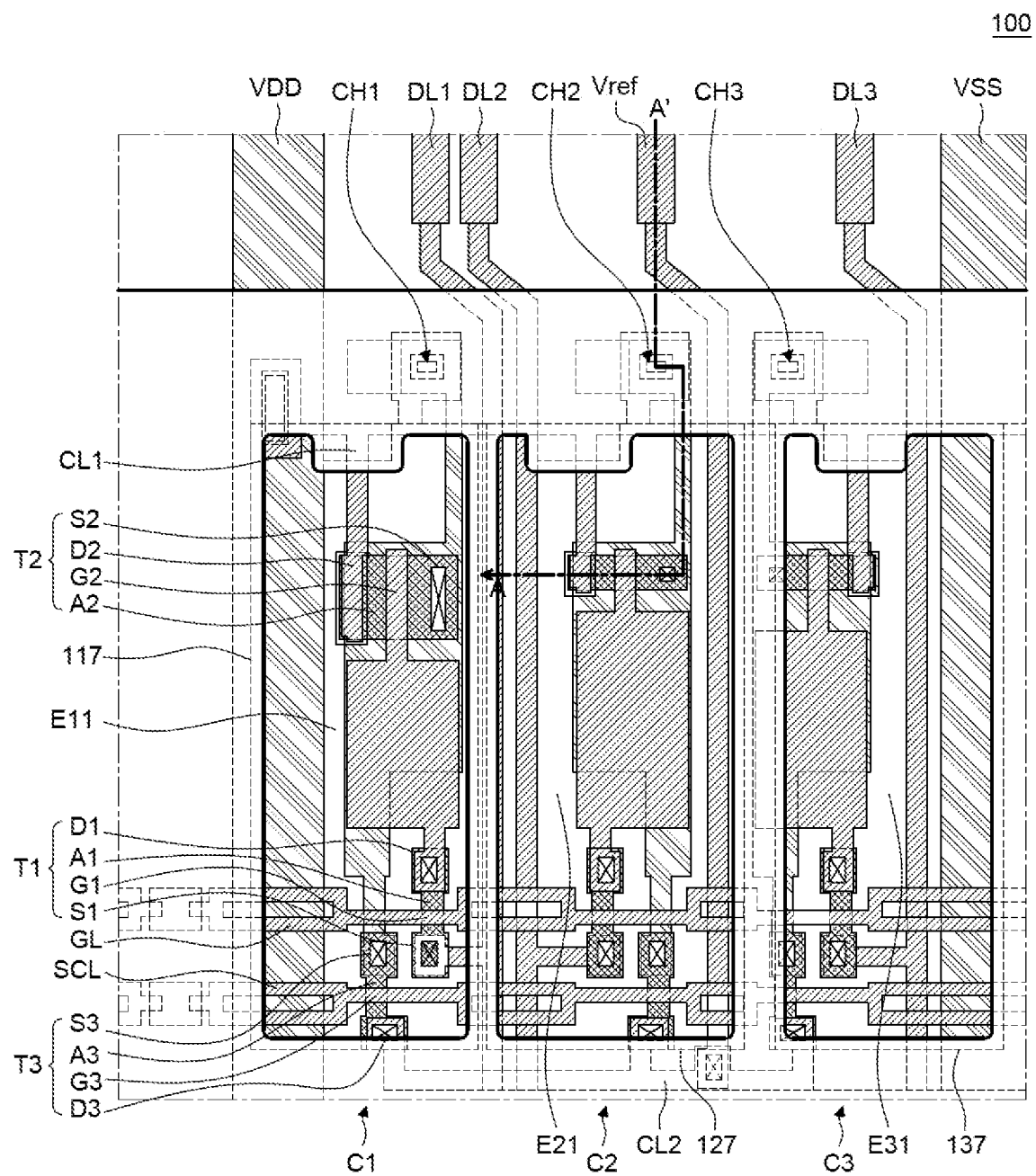
FIG. 3 is a plan view showing the placement of a plurality of emission areas in the organic light-emitting display device according to an embodiment of the present disclosure.

FIG. 3 is a plan view showing the placement of a plurality of emission areas in the organic light-emitting display device according to an embodiment of the present disclosure.

As shown in FIG. 3, a first emission area E11 may be formed to overlap the first circuit column C1. Specifically, the first emission area E11 may be formed to overlap a switching thin film transistor T1, a sensing thin film transistor T2, and a driving thin film transistor T3 in the first circuit column C1.

The first emission area E11 overlaps a first electrode 117 serving as an anode of an organic light emitting diode. The first electrode 117 overlapping the first emission area E11 may have a larger area than the first emission area E11.

The first electrode 117 overlapping the first emission area E11 may overlap the first circuit column C1 and may also overlap a part of the high-potential line VDD. Further, the first electrode 117 overlapping the first emission area E11 may be connected, through a first contact hole CH1, to the second source electrode S2 of the driving thin film transistor T2 provided in the first circuit column C1.

A second emission area E21 may be formed to overlap the second circuit column C2. Specifically, the second emission area E21 may be formed to overlap a switching thin film transistor T1, a sensing thin film transistor T2, and a driving thin film transistor T3 in the second circuit column C2.

The second emission area E21 overlaps a first electrode 127 serving as an anode of an organic light emitting diode. The first electrode 127 overlapping the second emission area E21 may have a larger area than the second emission area E21.

The first electrode 127 overlapping the second emission area E21 may overlap the second circuit column C2 and may also overlap the second data line DL2 and the reference line Vref. Further, the first electrode 127 overlapping the second emission area E21 may be connected, through a second contact hole CH2, to the second source electrode S2 of the driving thin film transistor T2 provided in the second circuit column C2.

A third emission area E31 may be formed to overlap the third circuit column C3. Specifically, the third emission area E31 may be formed to overlap a switching thin film transistor T1, a sensing thin film transistor T2, and a driving thin film transistor T3 in the third circuit column C3.

The third emission area E31 overlaps a first electrode 137 serving as an anode of an organic light emitting diode. The first electrode 137 overlapping the third emission area E31 may have a larger area than the third emission area E31.

The first electrode 137 overlapping the third emission area E31 may overlap the third circuit column C3 and may also overlap the third data line DL3 and a part of the low-potential line VSS. Further, the first electrode 137 overlapping the third emission area E31 may be connected, through a third contact hole CH3, to the second source electrode S2 of the driving thin film transistor T3 provided in the third circuit column C3.

Light emission of the first emission area E11 is controlled by the circuit components provided in the first circuit column C1, and light emission of the second emission area E21 is controlled by the circuit components provided in the second circuit column C2. Also, light emission of the third emission area E31 may be controlled by the circuit components provided in the third circuit column C3.

In this case, the first emission area E11, the second emission area E21, and the third emission area E31 may be formed by a bank 119 located on each of the electrodes 117, 127, and 137.

The bank 119 may be formed at the boundaries of the respective emission areas E11, E21, and E31 while covering parts of the respective electrodes 117, 127, and 137 to determine the sizes of the emission areas. That is, opening areas where the bank 119 is not formed on the respective electrodes 117, 127, and 137 may become emission areas. In this case, the bank 119 may be provided as one body having a matrix structure. Therefore, the bank 119 may be provided to overlap the first contact hole CH1, the second contact hole CH2, and the third contact hole CH3.

Organic light emitting layers may be formed in the emission areas between the banks 119. Specifically, the organic light emitting layers may be formed in the first emission area E11, the second emission area E21 and the third emission area E31 between the banks 119. In this case, the organic light emitting layers may be provided on the respective electrodes 117, 127, and 137 corresponding to the openings of the bank 119.

In this case, an organic light emitting layer formed in the first emission area E11 may be configured to emit light of red R. Also, an organic light emitting layer formed in the second emission area E21 may be configured to emit light of green G. Further, an organic light emitting layer formed in the third emission area E31 may be configured to emit light of blue B. In this case, each of the circuit columns C1, C2, and C3 located under the respective organic light emitting layers may include an insulating layer or a planarization layer and thus may have a structure with a minimized step. Therefore, the organic light emitting layers located on the electrodes 117, 127, and 137 are formed to have uniform profiles within the emission areas E11, E21, and E31, respectively. Thus, light can be emitted uniformly.

Figure 4:
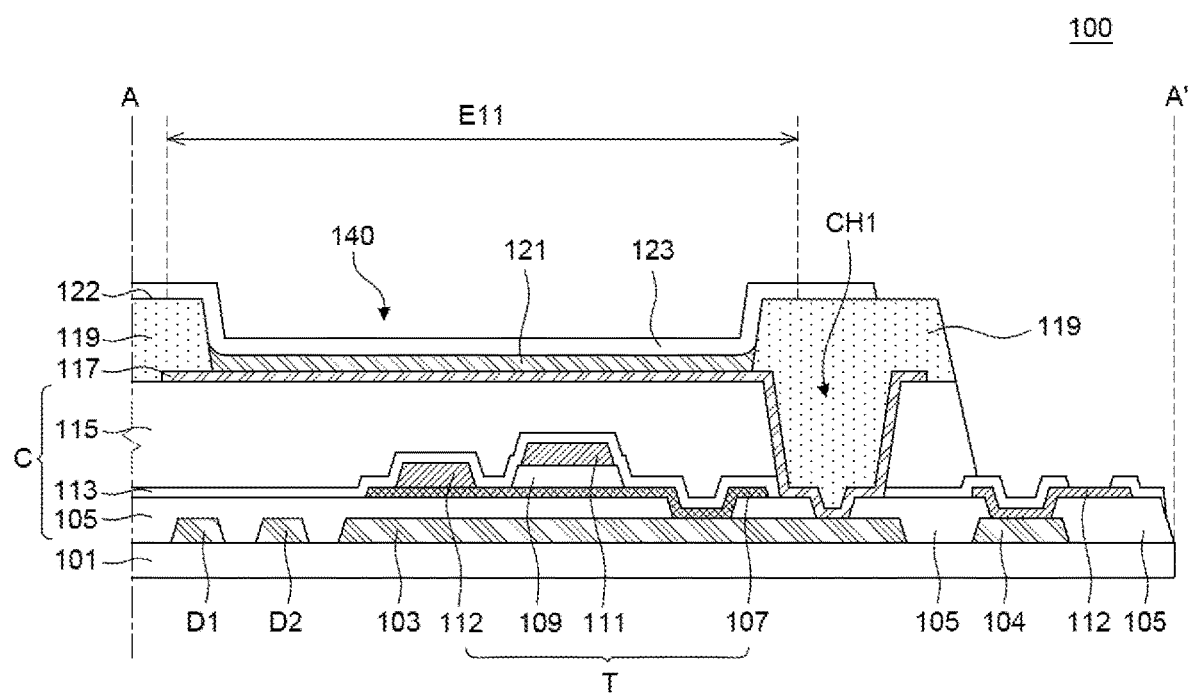
FIG. 4 is a schematic cross-sectional view of the organic light-emitting display device according to an embodiment of the present disclosure as taken along a line A-A' of FIG. 3.

FIG. 4 is a schematic cross-sectional view of the organic light-emitting display device according to an embodiment of the present disclosure as taken along a line A-A' of FIG. 3.

As shown in FIG. 4, the organic light-emitting display device according to an embodiment of the present disclosure includes a substrate 101, a circuit layer C, the first electrode 117, the bank 119, an organic light emitting layer 121, and a second electrode 123.

In this case, the driving thin film transistor T2 of the first column C1 among the circuit columns C1, C2, and C3 shown in FIG. 2 and FIG. 3 will be described as an example of the circuit layer C. However, the structure of the circuit layer C is not limited thereto. The structure of the circuit layer C may be changed depending on the thin film transistors T1, T2, and T3 provided in the respective circuit columns C1, C2, and C3.

The circuit layer C is formed on the substrate 101. The circuit layer C may be composed of a shielding pattern 103, a buffer layer 105, a thin film transistor T, a passivation layer 113, and a planarization layer 115.

The shielding pattern 103 is formed on the substrate 101. The shielding pattern 103 may be located under the thin film transistor T and may have a larger width than an active layer 107 included in the thin film transistor T. The shielding pattern 103 located under the thin film transistor T may serve to shield incident light into the active layer 107 of the thin film transistor T. Further, the shielding pattern 103 may protect the active layer 107 against moisture permeating from the outside and thus suppress changes in element characteristics (e.g., threshold voltage, etc.) of the active layer 107. Therefore, the shielding pattern 103 can minimize an imbalance in brightness between pixels (which appears as mura or residual image).

The shielding pattern 103 may be formed of a conductive material. In this case, the shielding pattern 103 may be formed of the same material as a gate electrode 111. That is, the shielding pattern 103 may be formed of metal and thus can be electrically connected.

The shielding pattern 103 may be electrically connected to the active layer 107. Therefore, the shielding pattern 103 can serve as a source electrode or drain electrode without a separate source electrode or drain electrode. Further, the shielding pattern 103 may be electrically connected to the first electrode 117. Therefore, a signal can be supplied to the first electrode 117 through the shielding pattern 103.

Also, the shielding pattern 103 may be disposed as a part of a pad on one side of the substrate 101.

Specifically, the pad may be composed of a shielding pattern material 104 as a part of the shielding pattern 103 and a gate material 112 disposed on the shielding pattern material 104. The gate material 112 disposed on the shielding pattern material 104 may be a metal pattern to which an external module, e.g., a flexible printed circuit board (FPCB) or a chip on film (COF) is bonded.

The shielding pattern material 104 configuring the pad may transmit a signal from the external module to the circuit layer C. For example, the shielding pattern material 104 of the pad may transmit various signals such as a data signal, a high-potential signal, a low-potential signal, a reference signal, etc.

The buffer layer 105 is located on the shielding pattern 103. In this case, the buffer layer 105 insulates the shielding pattern 103 from the active layer 107 of the thin film transistor T. The buffer layer 105 may include a contact hole. A part of the active layer 107 may be electrically connected to a part of the shielding pattern 103 through the contact hole provided in the buffer layer 105. The shielding pattern 103 connected through the contact hole in the buffer layer 105 may serve as a source electrode or a drain electrode.

In this case, the buffer layer 105 may include a plurality of layers. The buffer layer 105 including a plurality of layers may be formed by alternately laminating silicon nitride (SiNx) and silicon oxide (SiOx). Also, the buffer layer 105 may suppress permeation of moisture and/or oxygen into the active layer 107 of the thin film transistor T through the substrate 101. In this case, the buffer layer 105 including a plurality of layers may be further provided or may be removed depending on the material disposed on the substrate 101 or the kind of a layer formed thereon.

The thin film transistor T may include the active layer 107 located on the buffer layer 105, a gate insulating film 109 located on the active layer 107, the gate electrode 111 located on the gate insulating film 109, and the gate material 112 electrically connected to the active layer 107.

The active layer 107 is located on the buffer layer 105. In this case, the active layer 107 may have a smaller width than the shielding pattern 103 but is not limited thereto. The active layer 107 may be formed of polycrystalline silicon, and in this case, a predetermined region of the active layer 107 may be doped with impurities. Further, the active layer 107 may be formed of amorphous silicon, an organic semiconductor material, or oxide.

The gate insulating film 109 may be located on the active layer 107. The gate insulating film 109 insulates the gate electrode 111 from the active layer 107. In this case, the gate insulating film 109 may be formed of an inorganic insulating material such as silicon oxide (SiOx) or silicon nitride (SiNx) or may also be formed of an organic insulating material.

The gate electrode 111 may be located on the gate insulating film 109. The gate electrode 111 may be formed of any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto. The gate electrode 111 may be formed of various materials. Further, the gate electrode 111 may be a single layer or a multilayer.

The gate material 112 may be located on the active layer 107. In this case, the gate material 112 may be a conductive material which can be electrically connected to the active layer 107. Therefore, the gate material 112 may be used as a connection electrode and thus can serve as a source electrode or a drain electrode without a separate source electrode or drain electrode. In this case, the gate material 112 may be formed of the same material by the same process as the gate electrode 111.

The passivation layer (or insulating film) 113 is located on the thin film transistor T. In this case, the passivation layer 113 protects the thin film transistor T by covering the thin film transistor T.

The planarization layer 115 is located on the passivation layer 113. The planarization layer 115 protects the thin film transistor T and flattens an upper part of the thin film transistor T. The planarization layer 115 may be formed of one or more materials of polyacrylates resin, epoxy resin, phenolic resin, polyamides resin, polyimides resin, unsaturated polyesters resin, poly-phenylenethers resin, polyphenylenesulfides resin, and benzocyclobutene, but is not limited thereto. The planarization layer 115 may be formed of a single layer, a double layer, or a multilayer. As such, the planarization layer 115 can be formed variously.

The first electrode 117 is located on the planarization layer 115. The first electrode 117 may be electrically connected to an extended part of the shielding pattern 103 through the contact holes CH1 formed in the planarization layer 115, the passivation layer 113, and the buffer layer 105. In this case, the contact holes CH1 in the planarization layer 115, the passivation layer 113, and the buffer layer 105 may be overlapped.

The first electrode 117 may serve as an anode of the organic light-emitting display device. The organic light-emitting display device according to an embodiment of the present disclosure is a top-emission organic light-emitting display device. Thus, the first electrode 117 may be formed of an opaque conductive material having high reflectivity. For example, the first electrode 117 may be formed of silver (Ag), aluminum (Al), gold (Au), molybdenum (Mo), tungsten (W), chromium (Cr), or an alloy thereof (e.g., Ag;Pb;Cu (APC)), but is not limited thereto.

The bank 119 may be formed on the first electrode 117. The bank 119 may cover both ends of the first electrode 117. For example, a first bank portion may partially cover one end of the first electrode 117 and a second bank portion may partially cover the other end of the first electrode 117. Further, the bank 119 may overlap the contact hole CH1 so as to cover the first electrode 117 on the contact hole CH1. Therefore, a part of the first electrode 117 not covered by the bank 119 may be exposed and may become an opening 140. Therefore, the opening 140 exposed by the banks 119 may be formed as an emission area.

The bank 119 may be formed of an organic insulating material having hydrophilicity. In this case, the organic light emitting layer 121 may spread well to a side surface of the bank 119 and thus may be formed uniformly in the emission area. Meanwhile, if the entire bank 119 has a hydrophilic property, the organic light emitting layer 121 formed in the emission area may flood into an adjacent emission area through a top surface 122 of the bank 119. Thus, the organic light emitting layer 121 may be mixed with another organic light emitting layer in the adjacent emission area. Therefore, the top surface 122 of the bank 119 may be formed having a hydrophobic property to suppress mixing of the organic light emitting layer 121 with another organic light emitting layer adjacent thereto. To this end, the bank 119 may have a pattern formed by coating a solution in which a hydrophobic material such as fluorine is mixed with a hydrophilic organic insulating material and then performing a photolithography process. The hydrophobic material such as fluorine may be moved to the top portion of the bank 119 by light irradiated during the photolithography process. Thus, the top portion of the bank 119 may have a hydrophobic property. Except for the hydrophobic top portion of the bank 119, the remaining portion (e.g., the bottom portion) of the bank 119 may have a hydrophilic property. In this case, since the top surface 122 of the bank 119 has a hydrophobic property, it is possible to suppress the degree of spread of the organic light emitting layer 121 to the top surface 122 of the bank 119. While the figure does not show the bank 119 divided into a top portion and a bottom portion, a person of ordinary skill in the art will be able to understand how to suitably divide the top and bottom portions of the bank that allows to suppress the degree of spreading of the organic light emitting layer 121 to the top surface 122 of the bank 119 since this is within the skill of the person of ordinary skill in the art. Therefore, it is possible to minimize or reduce mixing of the organic light emitting layer 121 with another organic light emitting layer adjacent thereto.

The organic light emitting layer 121 may be formed on the emission area, e.g., the opening 140 exposed by the bank 119. In this case, the organic light emitting layer 121 may be located on the first electrode 117 not covered by the bank. Further, the organic light emitting layer 121 may partially cover slanted parts (or side surfaces) of the bank 119 covering both ends of the first electrode 117.

The organic light emitting layer 121 may be composed of at least one organic layer of a hole injection layer (HIL), a hole transporting layer (HTL), an emitting material layer (EML), and an electron transporting layer (ETL).

The organic light emitting layer 121 may be formed in the emission area by an ink-jet process without a mask. In this case, after a solution for the organic light emitting layer 121 is dried, the organic light emitting layer 121 may have a profile in which the height of the organic light emitting layer 121 decreases from the edges of the emission area, specifically the edges of the emission area in contact with the bank 119, toward the center of the emission area. Therefore, the second electrode 123 located on the organic light emitting layer 121 may be formed having a profile corresponding to the profile of the organic light emitting layer 121.

The second electrode 123 may be formed on the organic light emitting layer 121. The second electrode 123 may serve as a cathode of the organic light-emitting display device. The second electrode 123 is formed not only on the organic light emitting layer 121 but also on the bank 119. Thus, the second electrode 123 may be entirely formed on a plurality of pixels and the boundaries thereof. Therefore, the second electrode 123 may serve as a common electrode that applies a common voltage to the plurality of pixels. The organic light-emitting display device according to an embodiment of the present disclosure is a top-emission organic light-emitting display device. Thus, the second electrode 123 may be formed of a transparent conductive material to allow light emitted from the organic light emitting layer 121 to pass through toward an upper side or formed to a small thickness to increase transmittance. For example, the second electrode 123 may be formed of a transparent conductive material such as indium tin oxide (ITO) or indium zinc oxide (IZO) but is not limited thereto.

Specifically, although not illustrated in the drawings, an encapsulation layer may be further formed on the second electrode 123. The encapsulation layer may suppress permeation of external moisture into the organic light emitting layer 121. The encapsulation layer may be formed of an inorganic insulating material and may be formed by alternately laminating an inorganic insulating material and an organic insulating material but is not limited thereto.

Figure 5:
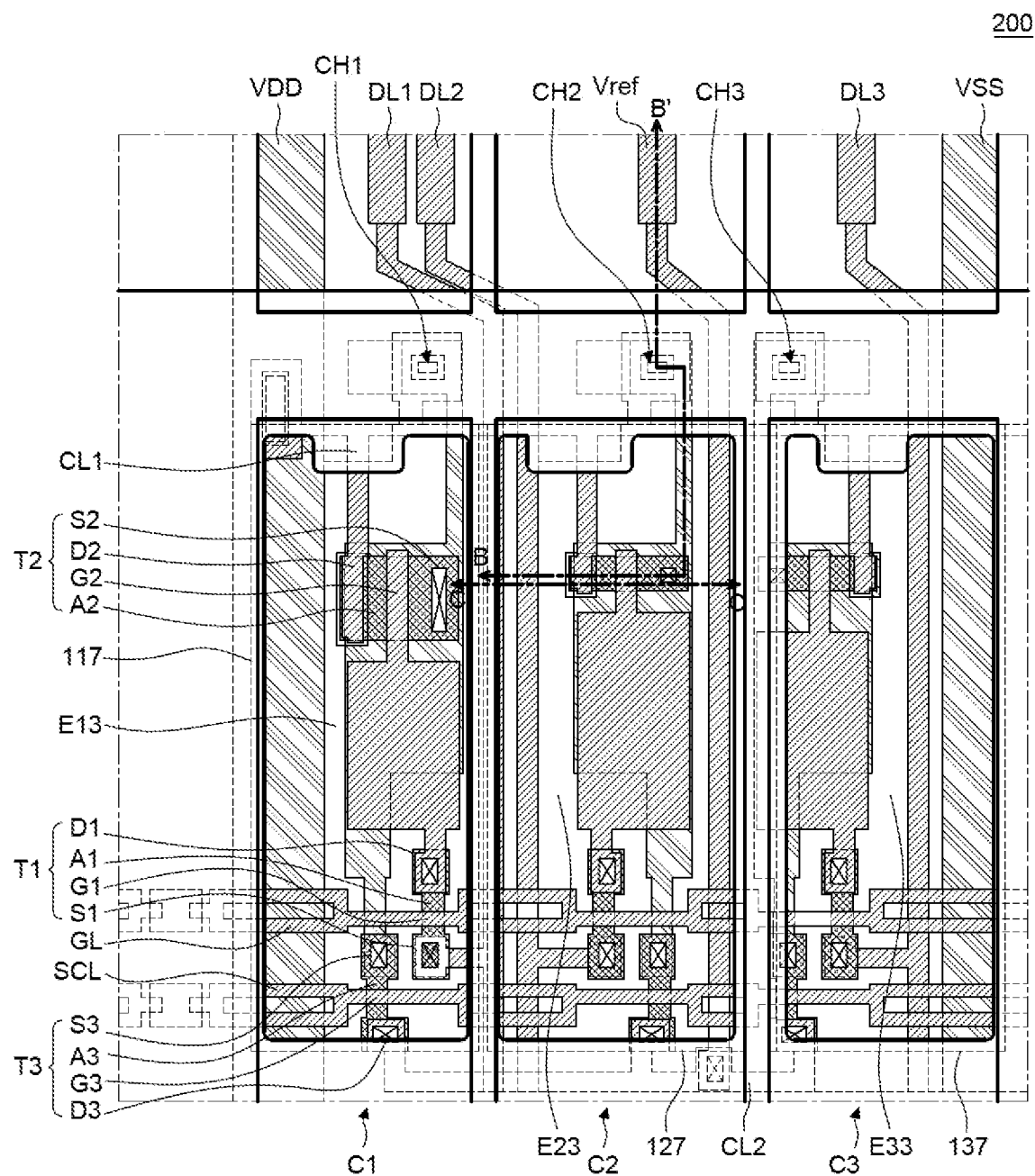
FIG. 5 is a plan view showing the placement of a plurality of emission areas in an organic light-emitting display device according to another embodiment of the present disclosure.

FIG. 5 is a plan view showing the placement of a plurality of emission areas in an organic light-emitting display device according to another embodiment of the present disclosure. The placement illustrated in FIG. 5 is identical to the placement illustrated in FIG. 3 in the structure of an emission area and a circuit column except for the structure of a bank and an organic light emitting layer. Therefore, redundant description of the same components will not be provided.

A first emission area E13, a second emission area E23, and a third emission area E33 may be formed by a first bank 219 and a second bank 220 located on each of the electrodes 117, 127, and 137, respectively.

The first bank 219 may determine the size of an emission area by covering a part of each of the electrodes 117, 127, and 137 and forming the boundary of each of the emission areas E13, E23, and E33. That is, an opening where the first bank 219 is not formed on each of the electrodes 117, 127, and 137 may become an emission area. In this case, the first bank 219 may be provided as one body having a matrix structure. Therefore, the first bank 219 may be provided to overlap the first contact hole CH1, the second contact hole CH2, and the third contact hole CH3.

The second bank 220 may be located on the first bank 219. In this case, the second bank 220 may have a linear structure extended in the vertical direction. In other embodiments, the second bank 220 can have a tapered structured that extends from the first banks 219. For example, the second bank 220 may have a thinner width towards the top portion of the second bank 220. Therefore, the second bank 220 may not be provided at the boundary between emission areas disposed in the vertical direction, but may be provided only at the boundary between emission areas disposed in a horizontal direction. In one embodiment, the second bank 220 includes a first auxiliary bank and a second auxiliary bank. The first auxiliary bank is mounted on the first bank portion and the second auxiliary bank is mounted on the second bank portion.

Specifically, the second bank 220 may be located on a part of the high-potential line VDD while corresponding to a left region of the first emission area E13. Also, the second bank 220 may be located on the first data line DL1 and the second data line DL2 while corresponding to a region between the first emission area E13 and the second emission area E23. Further, the second bank 220 may be located on the reference line Vref while corresponding to a region between the second emission area E23 and the third emission area E33. Furthermore, the second bank 220 may be located on a part of the low-potential line VSS while corresponding to a right region of the third emission area E33. In this case, the second bank 220 may be connected in the vertical direction.

Organic light emitting layers may be formed in the emission areas formed by the first bank 219 and the second bank 220. Specifically, the organic light emitting layers may be formed in the first emission area E13, the second emission area E23 and the third emission area E33 formed by the first bank 219 and the second bank 220. In this case, the organic light emitting layers may be provided on the respective electrodes 117, 127, and 137 corresponding to the openings of the first bank 219 and the second bank 220.

In this case, an organic light emitting layer formed in the first emission area E13 may be configured to emit light of red R. The organic light emitting layer formed in the first emission area E13 may be provided in the vertical direction. Specifically, the organic light emitting layers may be provided as connected to each other in a plurality of first emission areas E13 disposed in the vertical direction. Therefore, the organic light emitting layer formed in the first emission area E13 may also be formed in another adjacent first emission area E13 through the first bank 219. That is, the organic light emitting layer emitting light of red R may be connected vertically. Therefore, the organic light emitting layer formed in the first emission area E13 may cover a part of the first bank 219.

Further, an organic light emitting layer formed in the second emission area E23 may be configured to emit light of green G. The organic light emitting layer formed in the second emission area E23 may be provided in the vertical direction. Specifically, the organic light emitting layers may be provided as connected to each other in a plurality of second emission areas E23 disposed in the vertical direction. Therefore, the organic light emitting layer formed in the second emission area E23 may also be formed in another adjacent second emission area E23 through the first bank 219. That is, the organic light emitting layer emitting light of green G may be connected vertically. Therefore, the organic light emitting layer formed in the second emission area E23 may cover a part of the first bank 219.

Furthermore, an organic light emitting layer formed in the third emission area E33 may be configured to emit light of blue B. The organic light emitting layer formed in the third emission area E33 may be provided in the vertical direction. Specifically, the organic light emitting layers may be provided as connected to each other in a plurality of third emission areas E33 disposed in the vertical direction. Therefore, the organic light emitting layer formed in the third emission area E33 may also be formed in another adjacent third emission area E33 through the first bank 219. That is, the organic light emitting layer emitting light of blue B may be connected vertically. Therefore, the organic light emitting layer formed in the third emission area E33 may cover a part of the first bank 219.

In this case, each of the circuit columns C1, C2, and C3 located under the respective organic light emitting layers may include an insulating layer or a planarization layer and thus may have a structure with a minimized step. Therefore, the organic light emitting layers located on the electrodes 117, 127, and 137 are formed to have uniform profiles within the emission areas E13, E23, and E33, respectively. Thus, light can be emitted uniformly.

Also, the organic light emitting layers are formed in the emission areas adjacent to each other in the vertical direction. Thus, even if an organic light-emitting material is excessively supplied into each of the emission areas E13, E23, and E33 during an ink-jet process, the organic light-emitting material may be dispersed in the vertical direction. Thus, a difference in height of the organic light-emitting material between the adjacent emission areas can be minimized. Therefore, the organic light emitting layers may have uniform profiles in the vertical direction, and, thus, light can be emitted uniformly.

Figure 6:
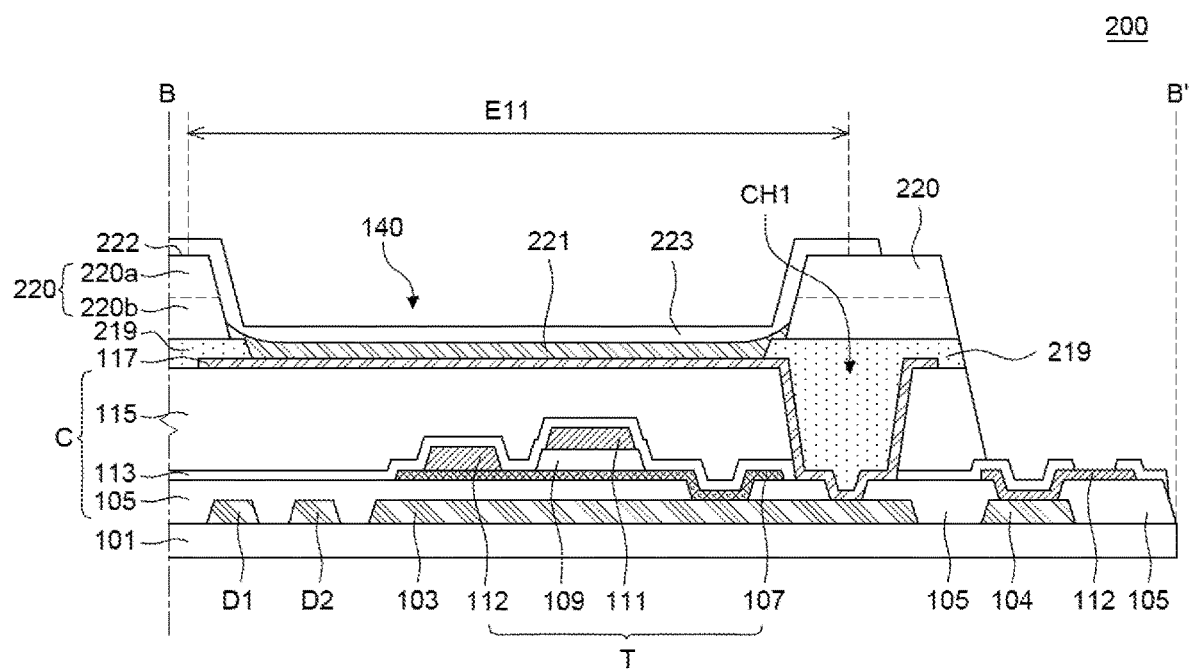
FIG. 6 is a schematic cross-sectional view of the organic light-emitting display device according to another embodiment of the present disclosure as taken along a line B-B' of FIG. 5.

FIG. 6 is a schematic cross-sectional view of the organic light-emitting display device according to another embodiment of the present disclosure as taken along a line B-B' of FIG. 5. An organic light-emitting display device illustrated in FIG. 6 has substantially the same configuration as the organic light-emitting display device illustrated in FIG. 4 except for the structure of a bank, an organic light emitting layer, and a second electrode. Therefore, redundant description of the same components will not be provided.

The first banks 219 may be formed on the first electrode 117. The first banks 219 may cover both ends of the first electrode 117. In one embodiment, the first banks 219 have a first bank portion covering one end of the first electrode 117 and a second bank portion covering the opposite end of the first electrode 117. Further, the first banks 219 may overlap the contact hole CH1 so as to cover the first electrode 117 on the contact hole CH1. Therefore, a part of the first electrode 117 not covered by the first bank 219 may be exposed and may become an opening. Therefore, the opening exposed by the first bank 219 may be formed as an emission area.

The second bank (or auxiliary bank) 220 may be formed on the first bank 219. In this case, the second bank 220 may be located on the outer side than the first bank 219 so as to overlap the contact hole CH1. Further, the second bank 220 is not provided on the first bank 219 at the boundary between emission areas disposed in the vertical direction. The second bank 220 may be provided on the first bank 219 at the boundary between emission areas disposed in the horizontal direction. In other embodiments, the second bank 220 can have a tapered structured that extends from the first banks 219. For example, the second bank 220 may have a thinner width towards the top portion of the second bank 220.

Furthermore, the second bank 220 may be located on a part of the first bank 219 at the boundary between the outermost emission areas. Specifically, the second bank 220 is disposed to suppress flooding of an organic light emitting layer 221 formed by an ink-jet process toward the outside of the second bank 220. Therefore, the second bank 220 may be provided on the first bank 219 disposed in the outermost region of the outermost emission area. In this case, the first bank 219 disposed in the outermost region of the emission area may be adjacent to the shielding pattern material 104 and the gate material 112 of the pad.

Therefore, a part of the first electrode 117 not covered by the first bank 219 and the second bank 220 may be exposed and may become an opening. The opening exposed by the first bank 219 and the second bank 220 may be formed as an emission area.

The first bank 219 may be formed of an organic insulating material having hydrophilicity. In this case, the organic light emitting layer 221 may spread well to a side surface of the first bank 219 and thus may be formed uniformly in the emission area.

The second bank 220 is provided such that the organic light emitting layer 221 in emission areas emitting light of the same color and disposed in the vertical direction can spread well to be formed uniformly in the emission areas disposed in the vertical direction. Further, the second bank 220 is provided such that the organic light emitting layer 221 in emission areas emitting light of different colors and disposed in the horizontal direction cannot flood into another adjacent emission area through a top surface of the second bank 220. Thus, it is possible to suppress mixing of the organic light emitting layer 221 with another organic light emitting layer adjacent thereto.

Therefore, the second bank 220 may be formed of an organic insulating material having hydrophobicity to satisfy the above-described two conditions. In this case, the second bank 220 may have a pattern formed by coating a solution in which a hydrophobic material such as fluorine is mixed with a hydrophilic organic insulating material and then performing a photolithography process. The hydrophobic material such as fluorine may be moved to the top portion of the second bank 220 by light irradiated during the photolithography process. Thus, the top portion of the second bank 220 may have a hydrophobic property. Except for the hydrophobic top portion of the second bank 220, the remaining portion of the second bank 220 may have a hydrophilic property. The banks 119, 219 and 220 can be from by depositing one or more layers of material as a bank layer. Each bank layer can be deposited, formed and etched as is known in the art to have bank portions, as shown in the various figures herein with openings between each bank portion. Each bank portion is also referred to herein as a bank. While the figure does not show the second bank 220 divided into a top portion 220a and a bottom portion 220b, a person of ordinary skill in the art will be able to suitably divide the top and bottom portions 220a, 220b of the second bank 220 that allows to suppress the degree of spreading of the organic light emitting layer 221 to the top surface 222 of the second bank 220. In this case, since the top surface 222 of the second bank 220 has a hydrophobic property, it is possible to suppress the degree of spread of the organic light emitting layer 221 to the top surface 222 of the second bank 220.

In addition, the height of the second bank 220 may be higher than the height of the first bank 219. Therefore, it is possible to suppress the degree of flooding of the organic light emitting layer 221 formed in an emission area by an ink-jet process to another emission area adjacent thereto in the horizontal direction. Therefore, it is possible to minimize or reduce mixing of the organic light emitting layer 221 with another organic light emitting layer adjacent thereto in the horizontal direction.

The organic light emitting layer 221 may be formed in the emission area, e.g., the opening exposed by the first bank 219 and the second bank 220. Specifically, the organic light emitting layer 221 may be provided to be connected to a plurality of emission areas disposed in the vertical direction. In this case, the organic light emitting layer 221 may be located on the first electrode 117 not covered by the first bank 219 and the second bank 220. Further, the organic light emitting layer 221 may be located on the first bank 219 between emission areas adjacent to each other in the vertical direction. Furthermore, the organic light emitting layer 221 may entirely cover slanted parts (or side surfaces) and a top surface of the first bank 219 covering both ends of the first electrode 117. Also, the organic light emitting layer 221 may partially cover slanted parts (or side surfaces) of the second bank 220.

The organic light emitting layer 221 may be composed of at least one organic layer of a hole injection layer (HIL), a hole transporting layer (HTL), an emitting material layer (EML), and an electron transporting layer (ETL).

The organic light emitting layer 221 may be formed in the emission area by an ink-jet process without a mask. In this case, after a solution for the organic light emitting layer 221 is dried, the organic light emitting layer 221 may have a profile in which the height of the organic light emitting layer 221 decreases from the edges of the emission area, specifically the edges of the emission area in contact with the first bank 219 and the second bank 220, toward the center of the emission area. Therefore, a second electrode 223 located on the organic light emitting layer 221 may be formed having a profile corresponding to the profile of the organic light emitting layer 221.

The second electrode 223 may be formed on the organic light emitting layer 221. The second electrode 223 may serve as a cathode of the organic light-emitting display device. The second electrode 223 is formed not only on the organic light emitting layer 221 but also on the second bank 220. Thus, the second electrode 223 may be entirely formed on a plurality of pixels and the boundaries thereof. Therefore, the second electrode 223 may serve as a common electrode that applies a common voltage to the plurality of pixels. The organic light-emitting display device according to an embodiment of the present disclosure is a top-emission organic light-emitting display device. Thus, the second electrode 223 may be formed of a transparent conductive material to allow light emitted from the organic light emitting layer 221 to pass through toward an upper side or formed to a small thickness to increase transmittance. For example, the second electrode 223 may be formed of a transparent conductive material such as indium tin oxide (ITO) or indium zinc oxide (IZO), but is not limited thereto.

Specifically, although not illustrated in the drawings, an encapsulation layer may be further formed on the second electrode 223. The encapsulation layer may suppress permeation of external moisture into the organic light emitting layer 221. The encapsulation layer may be formed of an inorganic insulating material and may be formed by alternately laminating an inorganic insulating material and an organic insulating material, but is not limited thereto.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device, comprising:
    a substrate;
    a shielding pattern located on the substrate;
    a buffer layer covering the shielding pattern and including a first contact hole and a second contact hole;
    a thin film transistor located on the buffer layer and electrically connected to the shielding pattern through the first contact hole;
    a conductive material located on the thin film transistor;
    an insulating film covering the conductive material and including a third contact hole corresponding to the second contact hole;
    a first electrode located on the insulating film and electrically connected to the shielding pattern through the second contact hole and the third contact hole;
    a first bank portion covering a first portion of the first electrode;
    a second bank portion covering a second portion of the first electrode;
    an opening formed between the first and second bank portions; and
    an organic light emitting layer located on the first electrode in the opening between the bank portions.

2. The organic light-emitting display device according to claim 1, wherein the conductive material includes a first conductive material and a second conductive material, and the first conductive material is electrically connected to the thin film transistor.

3. The organic light-emitting display device according to claim 2, wherein the second conductive material includes a gate insulating film thereunder and is electrically connected to an active layer included in the thin film transistor.

4. The organic light-emitting display device according to claim 3, wherein the first conductive material is formed of the same material as the second conductive material.

5. The organic light-emitting display device according to claim 4, wherein the second conductive material is a gate material.

6. The organic light-emitting display device according to claim 3, wherein the shielding pattern is a source electrode or a drain electrode electrically connected to the active layer.

7. The organic light-emitting display device according to claim 6, wherein the shielding pattern is further located on one side of the substrate and receives an external signal.

8. The organic light-emitting display device according to claim 7, wherein the shielding pattern is formed of the same material as the conductive material.

9. The organic light-emitting display device according to claim 1, further comprising:
    a first auxiliary bank located on the first bank portion; and
    a second auxiliary bank located on the second bank portion.

10. The organic light-emitting display device according to claim 9, wherein a height of the first and second auxiliary banks are higher than a height of the respective first and second bank portions.

11. The organic light-emitting display device according to claim 10, wherein the organic light emitting layer covers a side surface and a top surface of the first bank portion and a part of a side surface of the first auxiliary bank.

12. The organic light-emitting display device according to claim 10, wherein the organic light emitting layer covers a side surface and a top surface of the second bank portion and a part of a side surface of the second auxiliary bank.

13. The organic light-emitting display device according to claim 10, wherein the first bank portion and the second bank portion are provided as one body having a matrix structure.

14. The organic light-emitting display device according to claim 13, wherein the first and second auxiliary banks have a tapered shape.

15. The organic light-emitting display device according to claim 9, wherein the first and second bank portions are formed of a hydrophilic organic insulating material, and the first and second auxiliary banks are formed of a hydrophobic organic insulating material.

16. The organic light-emitting display device according to claim 15, wherein a top surface of the first and second auxiliary banks have a hydrophobic property to suppress spread of the organic light emitting layer.

* * * * *